United States Patent [19]
Bonora et al.

[11] Patent Number: 6,135,698
[45] Date of Patent: Oct. 24, 2000

[54] UNIVERSAL TOOL INTERFACE AND/OR WORKPIECE TRANSFER APPARATUS FOR SMIF AND OPEN POD APPLICATIONS

[75] Inventors: Anthony C. Bonora, Menlo Park; Edward J. Cortez, San Jose; J. Mark DiPaola, Livermore; Robert R. Netsch, Piedmont, all of Calif.

[73] Assignee: Asyst Technologies, Inc., Fremont, Calif.

[21] Appl. No.: 09/346,166

[22] Filed: Jul. 1, 1999

Related U.S. Application Data

[60] Provisional application No. 60/131,758, Apr. 30, 1999.

[51] Int. Cl.$^7$ .............................. B65G 49/07; H01L 21/00
[52] U.S. Cl. ...................... 414/416; 414/411; 414/217.1; 414/217.05; 414/937; 414/939; 414/940
[58] Field of Search ...................................... 414/411, 416, 414/217.1, 222.01, 222.04, 222.05, 222.06, 222.07, 222.08, 222.13, 292, 331.01, 331.14, 331.15, 937, 939, 940

[56] References Cited

U.S. PATENT DOCUMENTS

| | | | |
|---|---|---|---|
| 4,532,970 | 8/1985 | Tullis et al. | 414/939 X |
| 4,534,389 | 8/1985 | Tullis | 414/940 X |
| 5,605,428 | 2/1997 | Birkner et al. | 414/416 X |
| 5,674,039 | 10/1997 | Walker et al. | 414/937 X |
| 5,788,458 | 8/1998 | Bonora et al. | 414/416 X |
| 5,829,939 | 11/1998 | Iwai et al. | 414/416 X |
| 5,895,191 | 4/1999 | Bonora et al. | 414/940 X |
| 5,931,631 | 8/1999 | Bonora et al. | 414/416 |
| 5,984,610 | 11/1999 | Rush et al. | 414/416 |

*Primary Examiner*—Robert P. Olszewski
*Assistant Examiner*—Gerald J. O'Connor
*Attorney, Agent, or Firm*—Fliesler Dubb Meyer & Lovejoy LLP

[57] ABSTRACT

A universal interface and transfer apparatus is disclosed which may be configured either as an indexer or a load port opener. In each configuration, the universal interface and transfer apparatus includes a port plate having a central opening, and a port door fitting within and sealing the central opening when no pod is present on the apparatus. The apparatus further includes a base and a frame mounted on and extending up from a front of the base. A modular drive assembly is mounted within an exterior side of the frame, which drive assembly includes a linear drive screw, and a motor and torque transmission mechanism for rotating the linear drive screw. A carriage is mounted on the linear drive screw such that rotation of the linear drive screw results in vertical translation of the carriage. In a first configuration, the port plate is mounted to the carriage via a bracket extending between the port plate and carriage so that rotation of the linear drive screw will vertically translate the port plate while the port door remains stationary. In a second configuration, the port door is mounted to the carriage via an arm extending between the port door and carriage, while the port plate is stationarily mounted to the frame so that rotation of the linear drive screw will vertically translate the port door while the port plate remains stationary.

16 Claims, 12 Drawing Sheets

UNIVERSAL TOOL INTERFACE AND/OR WORKPIECE TRANSFER APPARATUS FOR SMIF AND OPEN POD APPLICATIONS

CLAIM OF PRIORITY

This application claims the benefit of U.S. Provisional Application Ser. No. 60/131,758 filed Apr. 30, 1999.

CROSS REFERENCE TO RELATED REFERENCE

The present invention is related to the following patents and applications, which patents and applications are assigned to the owner of the present invention and which patents and applications are incorporated by reference in their entirety herein:

U.S. Pat. No. 5,788,458, entitled, "Method and Apparatus for Vertical Transfer of a Semiconductor Wafer Cassette", issued Aug. 4, 1998;

U.S. patent application Ser. No. 08/730,643, entitled "Load Port Opener", filed Oct. 11, 1996, currently pending.

BACKGROUND OF THE INVENTION

1. Field of the Invention

The present invention relates to a transfer apparatus for use with standardized mechanical interface (SMIF) systems for facilitating semiconductor wafer fabrication, and in particular to an interface and transfer apparatus which may be configured either as an indexer which separates a workpiece carrying cassette from a storage and transport pod by lowering the pod door and cassette away from the stationary pod shell, or as a load port opener which separates the cassette from the pod by raising the pod shell away from the stationary pod door and cassette.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 0.5 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles become of interest.

A SMIF system has three main components: (1) minimum volume, sealed pods used for storing and transporting wafer cassettes; (2) a minienvironment supplied with ultraclean air flows surrounding cassette load ports and wafer processing areas of processing stations so that the environments inside the pods and minienvironment become miniature clean spaces, and (3) robotic transfer assemblies to load/unload wafer cassettes and/or wafers from the sealed pods to the processing equipment without contamination of the wafers in the wafer cassette from external environments. The system provides a continuous, ultraclean environment for the wafers as they move through the wafer fab.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is vertically oriented, and the wafers are supported either in a cassette mounted within the pod shell, or to shelves mounted in the pod shell.

In bottom opening configurations, in order to transfer a wafer cassette from within the SMIF pod to within a particular processing station, a pod is loaded either manually or automatedly onto a load port affixed to a front end of the process tool. For ergonomic reasons, Semiconductor Equipment and Materials International ("SEMI") has set a standard load height for the upper surface of the load port of approximately 900 mm from the ground. The upper surface of a load port is defined by a port plate including a central opening, and a port door, covering the central opening when no pod is present on the load port.

The pod is designed so that, when loaded onto the load port, the pod door overlies the port door, and the pod shell overlies the port plate. Once on the load port, mechanisms within the port door decouple the pod door from the pod shell so that the pod door and pod shell are supported on the port door and port plate, respectively. The port door and the port plate thereafter translated away from each other to separate the pod door from the pod shell to allow access to the cassette. A pick and place robot, such as for example a cylindrical body and arm robot, then transfers the cassette between the load port minienvironment and the process tool. Alternatively, the pick and place robot may include an end effector capable of gripping individual workpieces for transfer between the cassette and process tool.

In one type of load port configuration, referred to as an indexer, the port door is capable of vertical translation while the port plate remains in a fixed position at the load height (e.g., at 900 mm). In this configuration, after the pod is loaded onto the load port and the pod door and shell are decoupled from each other, the port door, with the pod door and cassette supported thereon, is lowered while the port plate and pod shell remain stationary at the load height. The cassette is lowered into a minienvironment beneath the port plate, from which the cassette and/or wafers may be transferred to and from the process tool. The port door is coupled to an elevator for translating the port door away from and back to the port plate.

In a second type of load port configuration, referred to as a load port opener, the port plate is capable of vertical translation while the port door remains in a fixed position at the load height. In this configuration, after the pod has been loaded onto the load port and the pod door and shell are decoupled, the port plate, with the pod shell supported thereon raise upward, while the port door, pod door and cassette remain stationary at the load height. A minienvironment is provided around the cassette as the port plate moves upward, from which minienvironment, the cassette and/or wafers may be transferred to and from the process tool. The port plate is coupled to an elevator for translating the port door away from and back to the port plate. An example of such a load port opener is disclosed in U.S. patent application Ser. No. 08/730,643, entitled "Load Port Opener", previously incorporated by reference.

Each load port configuration conventionally used to interface a SMIF pod with a process tools requires a significant investment of time and money to properly develop and maintain. For example, each load port used in a wafer fab requires a separate design concept, component design and selection, component qualification and procurement, prototype assembly, product testing and optimization, product certification, product documentation, inventory, manufacturing training and field service training.

The type of load port used in a wafer fab is dependent on the particular process tool configuration and requirements, and it is generally more advantageous to use one load port configuration over another. For example, in some process tools, there may not be sufficient space below the 900 mm load height for an indexer to lower the wafer cassette and then transfer the cassette and/or wafers between the load port and process tool. For such configurations, a load port opener configuration would be used. Alternatively, it may advantageous to use an indexer configuration because the lowering of the port door and cassette positions the wafers for transfer into the process tool at a relatively low height, and the wafer handling robot used to transfer the wafers need have only a relatively small z-axis stroke.

As such, semiconductor handling equipment manufacturers must provide both types of load port configurations. At present, the two separate configurations require two separate designs, and two separate processes for the manufacturing, testing, certification, documentation and maintenance of the load ports. Additionally, separate spare and replacement parts need to be stocked and supplied as needed for the separate configurations.

SUMMARY OF THE INVENTION

It is therefore an advantage of the present invention to provide a single load port which may be configured as either an indexer or a load port opener.

It is a further advantage of the present invention to reduce the overall cost and complexity of operation to semiconductor equipment handling manufacturers by providing a single load port which may be configured for use with process tools of different configurations and requirements.

It is another advantage of the present invention to reduce the development time necessary to provide configurable load ports.

It is a further advantage of the present invention to reduce the testing and certification time necessary to provide load ports of differing configurations.

It is a still further advantage of the present invention to reduce the number of parts which must be manufactured, stocked and supplied for load ports of differing configurations.

It is another advantage of the present invention to improve maintenance and serviceability by having differing load port configurations with a significant number of common components.

It is a further advantage of the present invention to increase the economies of scale associated with the manufacture and maintenance of differing load port configurations by allowing the use of common components across different load port configurations.

These and other advantages are provided by the present invention which in preferred embodiments relates to a universal interface and transfer apparatus which may be configured either as an indexer which separates a workpiece carrying cassette from a storage and transport pod by lowering the pod door and cassette away from the stationary pod shell, or as a load port opener which separates the cassette from the pod by raising the pod shell away from the stationary pod door and cassette. In each configuration, the universal interface and transfer apparatus includes a port plate having a central opening, and a port door fitting within and sealing the central opening when no pod is present on the apparatus. The apparatus further includes a base and a frame mounted on and extending up from a front of the base. A modular drive assembly is mounted within an exterior side of the frame, which drive assembly includes a linear drive screw, and a motor and torque transmission mechanism for rotating the linear drive screw. A carriage is mounted on the linear drive screw such that rotation of the linear drive screw results in vertical translation of the carriage.

In a first configuration, the port plate is mounted to the carriage via a bracket extending between the port plate and carriage. The port door is stationarily mounted to the base via standoffs. Thus, in the first configuration, rotation of the linear drive screw will vertically translate the port plate while the port door remains stationary. A pod carrying a cassette having one or more wafers is loaded onto the port plate and port door, preferably at the load height of 900 mm, either manually or by automated mechanisms. When properly located on the apparatus, the pod door is positioned on the port door and the pod shell is positioned on the port plate. Once the pod door is decoupled from the pod shell, the linear drive screw is activated so that the port plate moves upward to separate the pod shell from the pod door and cassette. Once the port plate has moved upward to a height above the cassette, a wafer handling robot or mechanism may enter through an opening in the frame to transfer the cassette and/or individual wafers from within the apparatus into the process tool, and then back again upon the completion of processing.

In addition to the above-described components, when in this first configuration, the universal interface and transfer apparatus may additionally include a telescopic cover for defining a clean minienvironment beneath the port plate, around the cassette, as the port plate rises. A fan and filtration unit may be provided in the base for circulating fluid and filtering out particles and contaminants. This configuration may further include a shield for covering the opening in the frame when the port plate is in its lowermost home position to prevent particles and contaminants from passing through the opening into the process tool.

In a second configuration, the port door is mounted to the carriage via an arm extending between the port door and carriage, while the port plate is stationarily mounted to the frame. Thus, in the second configuration, rotation of the linear drive screw will vertically translate the port door while the port plate remains stationary. In the second configuration, after a pod has been loaded onto the port plate and port door, the pod door is decoupled from the pod shell, and the port door lowers the cassette away from the pod shell. Once the port door has lowered so that the top of the cassette is clear of the port door, the pick and place robot within the process tool can then transfer the cassette and/or wafers into the process tool, and then back again after processing is complete. As in the first configuration, the apparatus may include a cover which extends between the port plate and base for creating a clean minienvironment around the cassette, as well as a fan and filtration system for circulating fluids and removing particulates and contaminants.

BRIEF DESCRIPTION OF THE DRAWINGS

The present invention will now be described with reference to the drawings in which.

DETAILED DESCRIPTION

The invention will now be described with reference to FIGS. 1 through 13, which in general relate to a universal tool interface and/or workpiece transfer apparatus which may be configured as either an indexer or a load port opener for separating a cassette and/or individual wafers from a SMIF pod for transfer to and from a processing station or elsewhere. In a preferred embodiment, the present invention is configured to operate with 200 mm SMIF pods and semiconductor wafers. However, it is understood that the present invention may operate with pods of various sizes, and with pods other than SMIF pods. It is also contemplated that the present invention operate with open cassettes or containers not transported within a pod as explained hereinafter. Moreover, it is understood that the present invention may be used to transfer cassettes and/or wafers to any processing station utilized in the fabrication and testing of semiconductor wafers in a cleanroom environment. The terms "wafer" and "semiconductor wafer" as used herein refer to a wafer substrate as it may exist in any of the various stages of the semiconductor wafer fabrication process. Furthermore, it is understood that the present invention may operate with workpieces other than semiconductor wafers, such as for example, flat panel displays, reticles, or other substrates.

Figure 1:
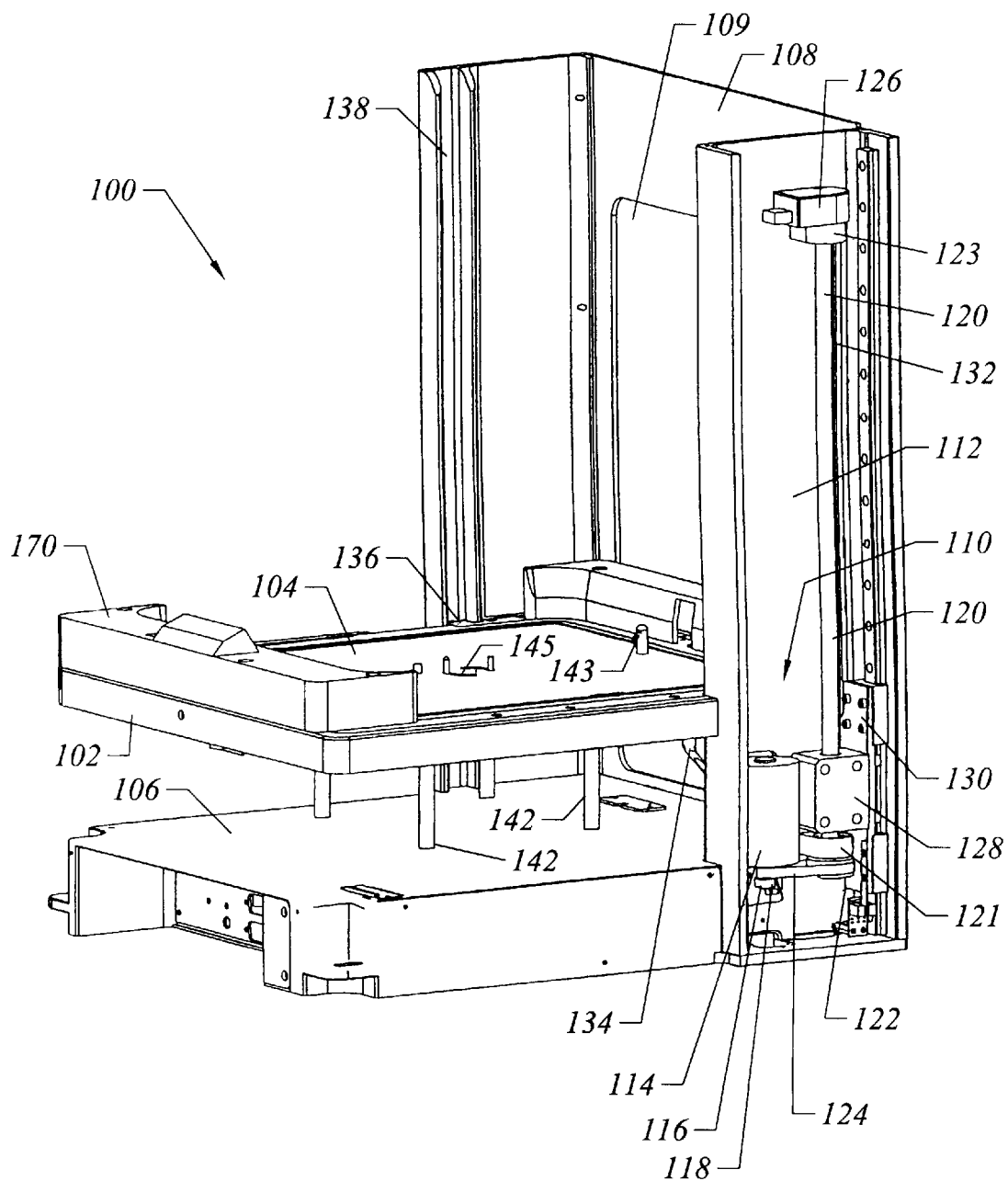
FIG. 1 is a perspective view of the universal interface and transfer apparatus configured as a load port opener.
Figure 2:
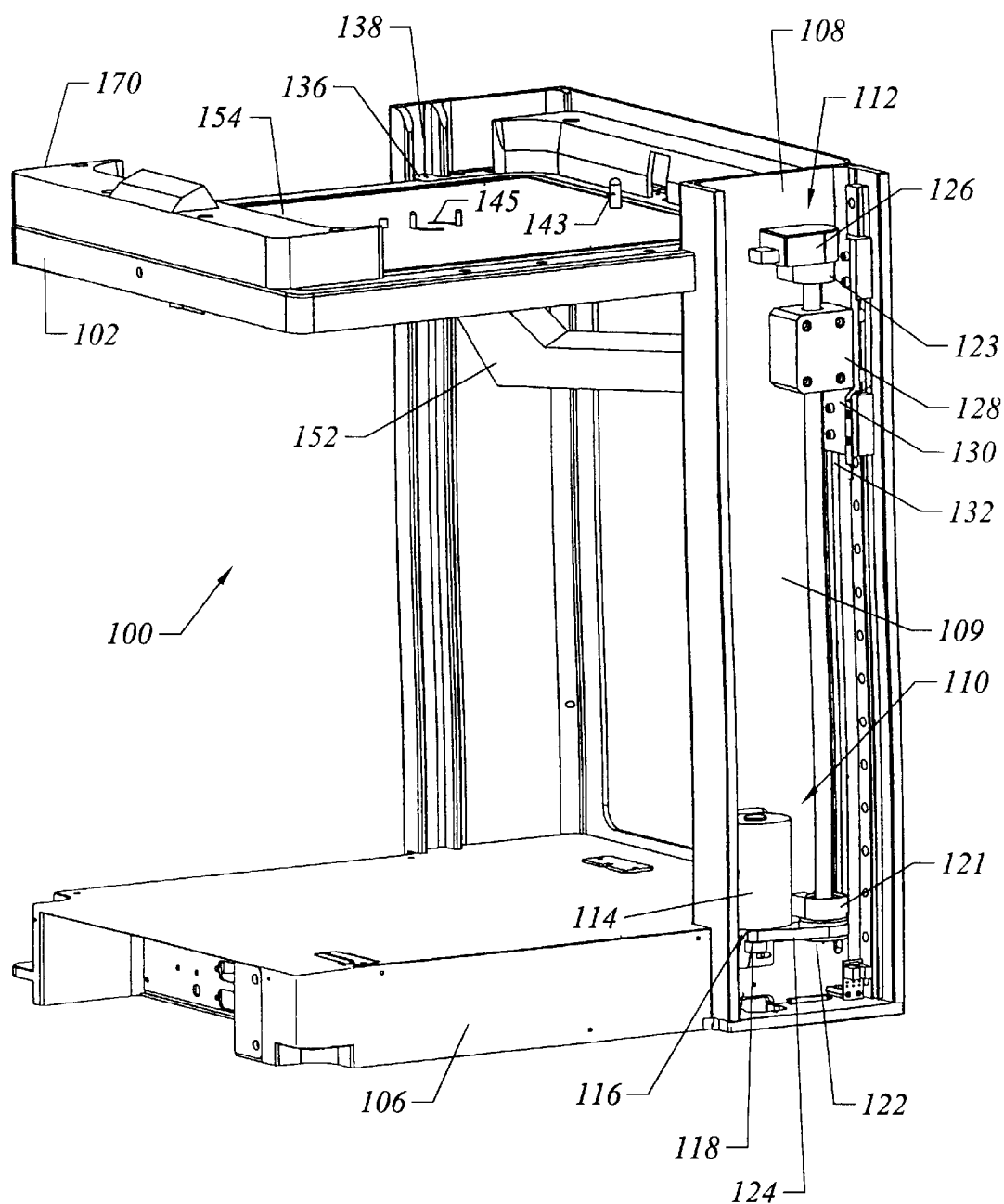
FIG. 2 is a perspective view of the universal interface and transfer apparatus according to the present invention configured as an indexer.

FIGS. 1 and 2 show perspective views of a universal interface and transfer apparatus 100 according to the present invention. In FIG. 1, the apparatus 100 is configured to operate as an LPO, and in FIG. 2, the apparatus 100 is configured to operate as an indexer. In each configuration, the universal interface and transfer apparatus 100 includes a port plate 102 including a central opening 175 (FIG. 3), and a port door 104 fitting within and sealing the central opening 175 when no pod is present on the apparatus 100. In a preferred embodiment, the port plate 102 and port door 104 may be formed of a temperature stable, rigid material having low outgassing properties, such as for example aluminum. It is understood that the port plate and port door may be formed of other materials, such as for example other metals or high strength plastics.

The apparatus further includes a base 106 and a frame 108 mounted on and extending up from a front of the base 106. The base 106 includes control electronics for the apparatus 100, as well as mounting mechanisms for mounting the apparatus 100 on the front end of a process tool. As will be explained in greater detail below, the apparatus need not be affixed to a process tool in alternative embodiments. In a preferred embodiment, the apparatus 100 is affixed to the front end of a process tool and aligned so that an opening 109 in the frame 108 at the front of the apparatus lies adjacent an access port to the process tool (not shown). Once a wafer carrying cassette is separated from the pod as explained hereinafter, a pick and place robot within the process tool may transfer the cassette and/or wafers between the apparatus 100 and the process tool, through opening 109. When affixed to a process tool, the apparatus 100 functions as an interface for allowing a cassette and/or wafers to be transferred from a clean environment within a SMIF pod to a clean environment within the process tool, without exposing the wafers to the relatively unclean air within the wafer fab. As explained hereinafter, in an alternative embodiment, the apparatus 100 may also function as a stand alone unit to separate a cassette from a SMIF pod for manual or automated transfer of the cassette elsewhere.

The apparatus 100 includes a modular drive assembly 110 mounted within an enclosure 112 on an exterior side portion of frame 108. The modular drive assembly is used to vertically translate either the port plate 102 or the port door 104, depending on the particular configuration of the universal interface and transfer apparatus. The modular drive assembly 110 includes a motor 114 including a drive shaft 116 and driven gear 118. Motor 114 is preferably a brushless multipole motor but it is understood that other types of motors or motive force mechanisms may be employed. Electrical leads (not shown) are provided for transferring power and control signals from the control electronics in the base to the motor. Modular drive assembly 110 further includes a threaded linear drive screw 120 having a first end rotationally mounted within a first bearing unit 121 extending from a bottom portion of frame 108, and a second end rotationally mounted within a second bearing unit 123 extending from a top portion of frame 108. It is understood that the linear drive screw 120 may be rotationally mounted within enclosure 112 by other known rotational mounting schemes.

Linear drive screw 120 includes a gear 122 fixed about and concentric with a lower portion of the linear drive screw. A continuous timing belt including teeth has a first end wrapped around driven gear 118 and a second end wrapped around gear 122. The gears 118, 122 and belt 124 serve to transmit torque from motor 114 to the linear drive screw 120. As is known in the art, the ratio of the size of gear 122 to driven gear 118 may be varied to control the torque and angular velocity imparted to linear drive screw 120 for a given output torque for motor 114 and angular velocity of drive shaft 116. It is further understood that alternative torque transmission mechanisms may be used in place of gears 118, 122 and belt 124. For example, belt 124 may be omitted, and a first gear concentric with and mounted to the motor 114 may mesh with a second gear concentric with and mounted to the linear drive screw 120. It is further contemplated that motor 114 may be moved concentrically below and affixed directly to linear drive screw 120 so that the torque and angular velocity outputted from motor 114 is transmitted directly to the linear drive screw 120. Although the motor 114, gears 118, 122 and belt 124 are shown mounted in a bottom portion of enclosure 112, it is understood that the components may alternatively be mounted in a top portion of enclosure 112.

Modular drive assembly 110 further includes an encoder 126, affixed to a top portion of the linear drive screw 120, which provides information relating to the actual rotational speed of linear drive screw 120. This information may be used together with the intended rotational speed of linear drive screw 120 from the control electronics to provide closed loop servo control of linear drive screw 120. Although the encoder 126 is shown at a top portion of linear drive screw 120, it is understood that the encoder may alternatively be mounted to the bottom of linear drive screw 120 or mounted to and concentric with drive shaft 116. Electrical leads (not shown) are provided for transferring electrical signals between the encoder 126 and the control electronics in the base 106.

A carriage 128 is mounted about linear drive screw 120 such that rotation of linear drive screw 120 in a first direction will cause vertical translation of carriage 128 upward, and rotation of linear drive screw 120 in the opposite direction will cause vertical translation of the carriage 128 downward. As explained in greater detail below, a bracket 130 mounts to and translates with carriage 128. A portion of the bracket extends inward toward a center of frame 108, through a slot 132 formed through a side portion of frame 108. The bracket affixes to either the port plate or the port door, to allow translation of either the port plate or the port door with carriage 128, depending on the configuration of apparatus 100.

Figure 3:
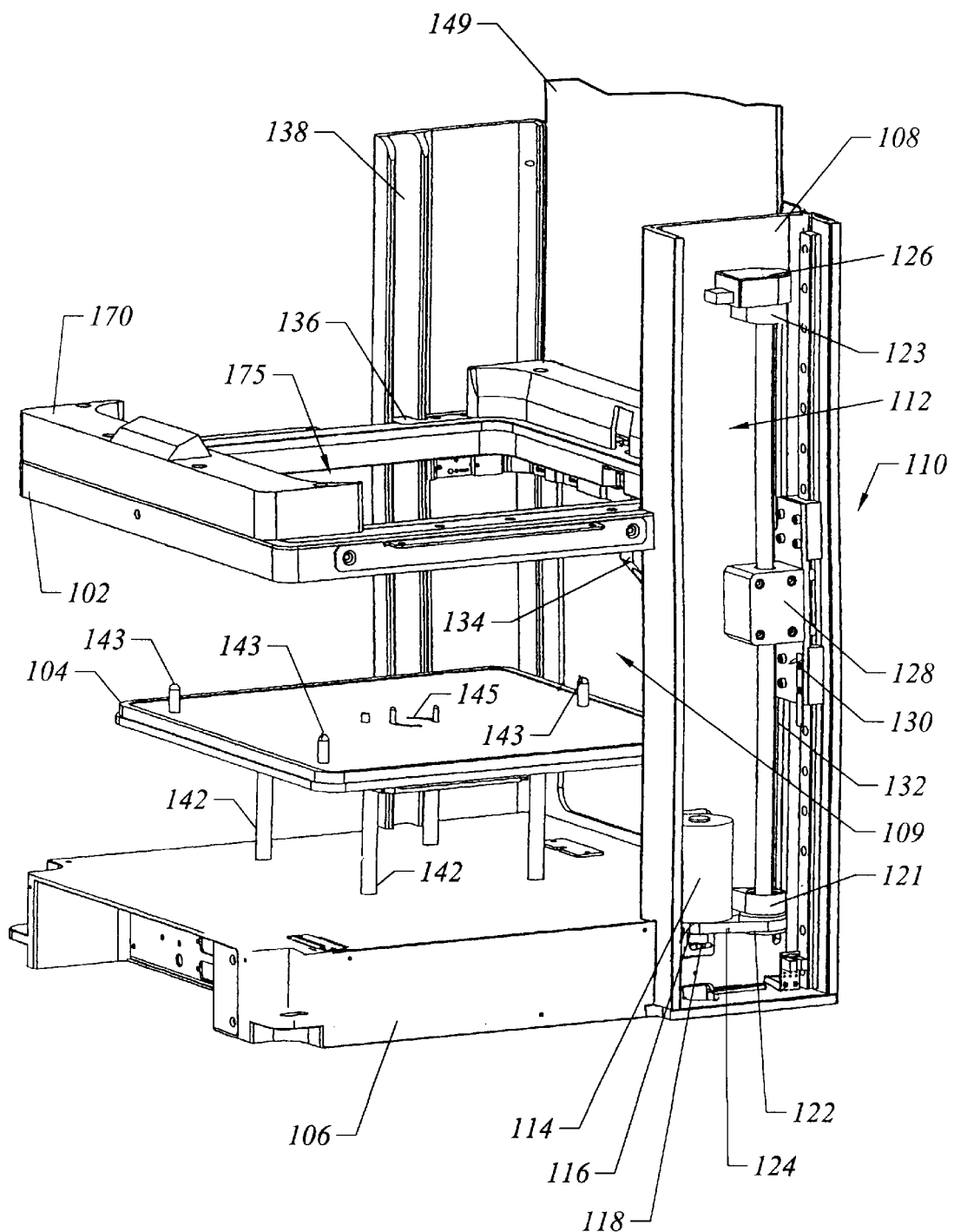
FIG. 3 is a perspective view of the universal interface and transfer apparatus according to the present invention configured as a load port opener and showing the port plate raised upward with respect to the port door.
Figures 6, 7:
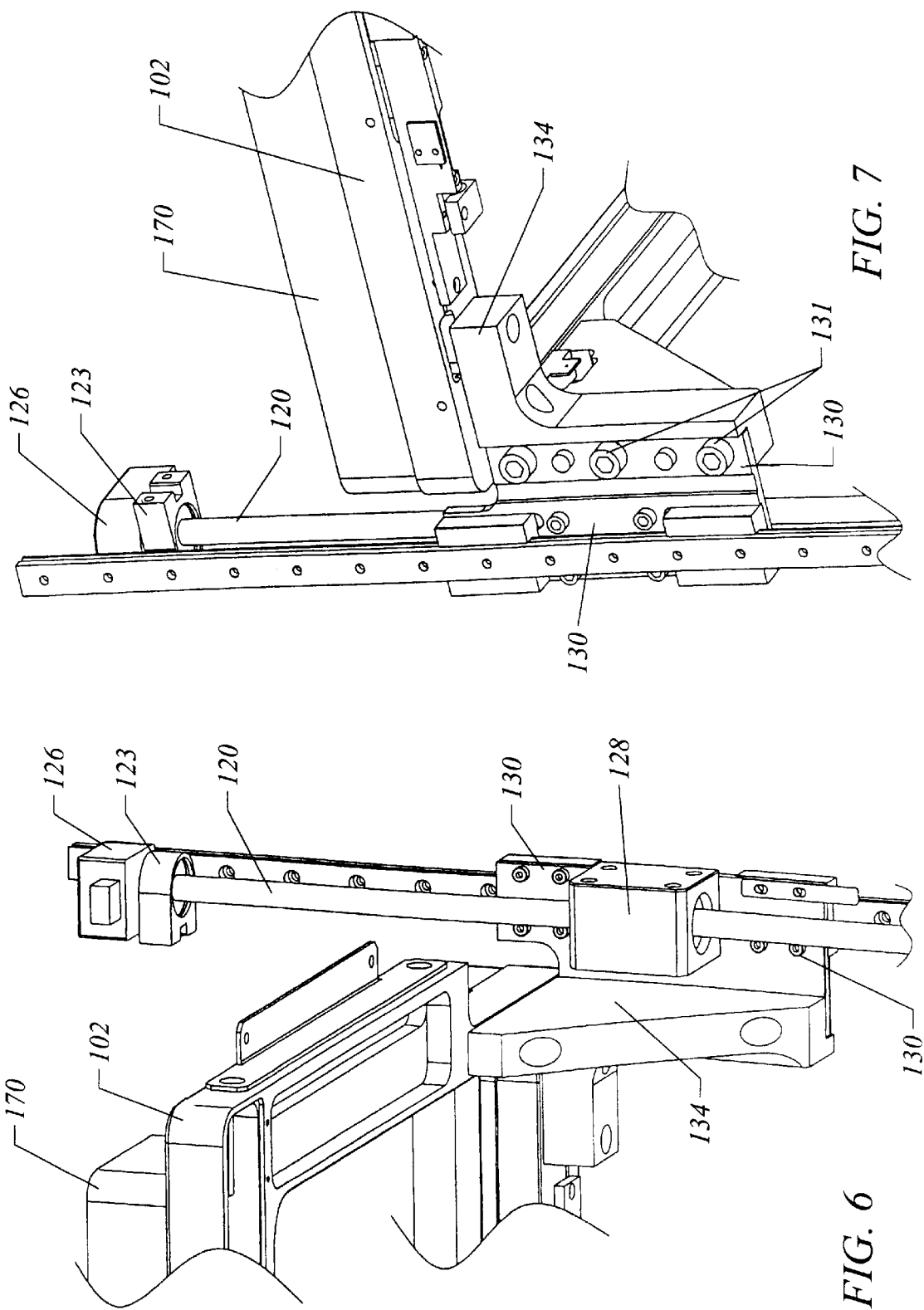
FIG. 6 is an enlarged partial perspective view showing the mechanisms for mounting the linear drive screw to the port plate when the apparatus is configured as a load port opener.
FIG. 7 is an enlarged partial perspective view showing the mechanisms for mounting the linear drive screw to the port plate when the apparatus is configured as a load port opener.

A first configuration of the universal interface and transfer apparatus 100 will now be described with reference to FIGS. 1 and 3–7. FIGS. 6 and 7, which are front and rear perspective views, respectively, with the frame 108 omitted, illustrate the bracket 130 affixed by removable screws or bolts 131 to a gusset 134. The gusset 134 is in turn affixed to a rear corner of port plate 102. The carriage 128, bracket 130 and gusset 134 support port plate 102 on linear drive screw 120 so that rotation of linear drive screw 120 will translate the port plate 102. As seen in FIGS. 1, 3 and 5, the rear corner of port plate 102 opposite that including gusset 134 may include a guide 136 seated within a track 138 to provide stability to support plate 102 as it translates.

Figure 4:
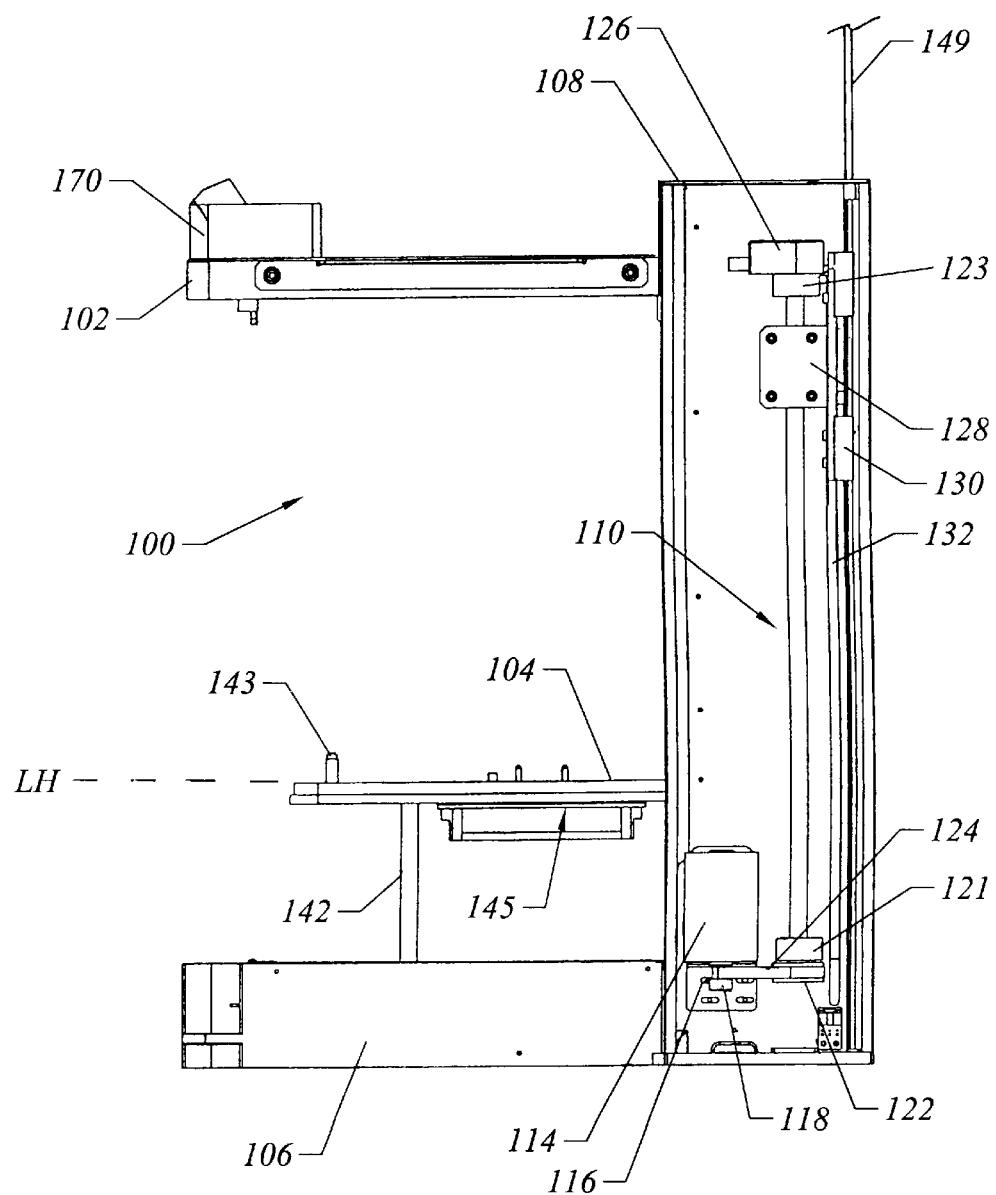
FIG. 4 is a side view of the universal interface and transfer apparatus according to the present invention configured as a load port opener showing the port plate raised with respect to the port door.
Figure 5:
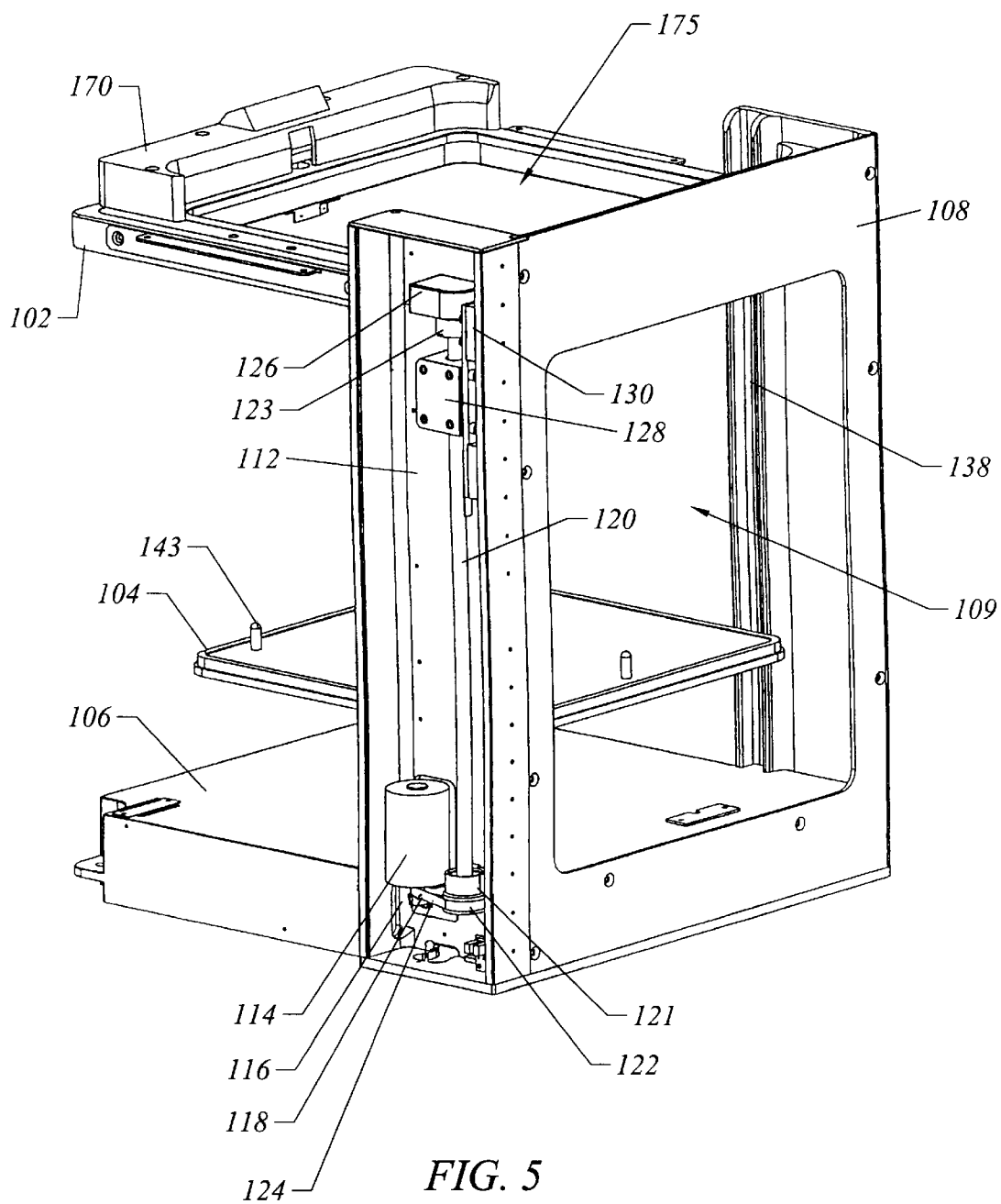
FIG. 5 is a perspective view of the universal interface and transfer apparatus according to the present invention configured as a load port opener showing the port plate raised with respect to the port door.

When configured as shown in FIGS. 1 and 3–7, the apparatus 100 is mounted at the front of a process tool so that the upper surface of the port plate and port door reside at a load height, indicated at reference line LH on FIG. 4, of approximately 900 mm. When configured according to the embodiment shown in FIGS. 1 and 3–7, port door 104 may be bolted to a plurality of standoffs 142 which are in turn mounted to base 106. Thus, the port door according to a preferred embodiment of this configuration remains stationary at the load height. As will be explained hereinafter, the port door may be mounted on base 106 for horizontal translation in alternative embodiments.

A pod carrying a cassette 50 having one or more wafers 52 (shown in the alternative embodiment of FIG. 10) is loaded onto the port plate and port door at the load height either manually or by automated mechanisms. In a preferred embodiment, the pod includes a pod shell 54 (FIG. 10) mating with a pod door 56 on which the cassette 50 is supported. When properly positioned on the apparatus 100, the pod door is supported on the port door 104 and the pod shell is supported on the port plate 102. The port door 104 may include a plurality of registration features 143 on its upper surface which mate within recesses on the bottom of the pod door to ensure proper and repeatable positioning of the pod door on the port door.

Once positioned on the apparatus 100, the pod door is separated from the pod shell by means of a latch mechanism 145 provided within the port door 104. Although not critical to the present invention, details related to such a latch mechanism are described in U.S. Pat. No. 4,995,430, entitled "Sealable Transportable Container Having Improved Latch Mechanism", which patent is assigned to the owner of the present application and is incorporated by reference in its entirety herein. The port plate 102 may include retaining clips 147 (shown for example in FIG. 11) which pivot into engagement with the pod shell once the pod shell is decoupled from the pod door to prevent removal of the pod shell from the port plate when the pod shell is decoupled from the pod door.

Once the pod door is decoupled from the pod shell, a signal is sent to the control electronics to activate motor 114 to thus rotate linear drive screw 120. Rotation of the linear drive screw 120 will cause translation of the carriage 128, bracket 130, gusset 134, plate 102 and the pod shell supported on the port plate from the position shown in FIG. 1 vertically upward to a position such as shown in FIGS. 3 and 5. Once the port plate 102 has moved upward to a height above the cassette, which remains stationarily seated on the port door 104, the pick and place robot from within the process tool may enter through opening 109 in the frame 108 to transfer the cassette and/or individual wafers from within apparatus 100 into the process tool, and then back again upon the completion of processing.

A telescopic cover 111 is preferably affixed to the port plate and base, around the sides and rear of the apparatus. The cover 111 is is partially shown in the alternative embodiment of FIGS. 11 and 12. Further details relating to such a cover are disclosed in U.S. patent application Ser. No. 08/730,643, entitled "Load Port Opener", which application has been previously incorporated by reference. The cover is preferably comprised of a plurality of leaves formed of stainless steel, aluminum or high strength and low outgassing plastic. When the cover is formed of plastic, it may preferably be transparent and UV colored to allow an operator to view a cassette within the apparatus 100 while at the same time preventing ambient light at less than 500 mm from entering into the process station. When the port plate is in a home position at the load height circumjacent about the port door, the leaves are vertically coextensive with each other. As the port plate begins to rise, a first leaf, then a second leaf, then a third leaf, etc., rises upward so that the cover extends telescopically. The cover provides a minienvironment beneath the port plate and around the cassette as the port plate moves upwards to prevent contaminants from the surrounding environment from coming into contact with the wafers or entering the process tool.

The pressure within the processing tool is generally maintained to be slightly higher than that of the surrounding environment, so that upon opening of the process tool access port to which the apparatus 100 is attached, clean air will flow from the process tool into the apparatus 100 and out of the apparatus 100 through spaces provided between the leaves of the cover. One of the leaves may include a flap pivotally mounted on a hinge on the outer surface of the leaf. If the pressure within the minienvironment becomes too great for the fluid to adequately escape through the spaces between the leaves, the flap will be pushed open to relieve pressure within the minienvironment. It is further contemplated that a self-contained fan and filtration system may be provided on the base 106 of apparatus 100 for circulating fluid and filtering out particles and contaminants. The fan and filtration system may circulate clean air, nitrogen, or other fluids for removing contaminants and for deionizing surfaces within the apparatus 100 to which wafers are exposed. It is understood that the cover may have other configurations, such as for example accordion-type walls around the sides and rear of the port plate.

Although seen only partially in FIGS. 3 and 4, the embodiment of FIGS. 1 and 3–7 preferably further includes a shield 149 mounted to and extending up from the port plate, adjacent to opening 109. The shield rises upward with the port plate to expose the opening 109 to allow cassette and/or wafer transfer therethrough when the port plate is in its raised position. When the port plate is in its home position at the load height, the shield 149 covers the opening 109. There may be a slight gap between the shield and the frame surrounding the opening 109 when covering the opening 109, and as the shield moves upward and downward. The process tool is maintained at a pressure slightly higher than that of the surrounding environment, so that air flows from the process tool, through the opening 109 and out of the gap between the shield and the frame. Thus, when the shield is covering the opening 109, particles and contaminants from within the fab are prevented from entering into the process tool. It is understood that the shield may comprise a pair of adjacent and parallel panels. When the port plate is in its uppermost position, the panels overlap each other, and when the port plate moves downward, the two panels move down together until the upper edge of one of the panels will engage a top portion of the frame, at which time that panel remains fixed. The second panel continues to move downward with the port plate until the port plate once again mates with the port door. The shield may alternatively comprise a single panel moving upward and downward with the port plate.

Figure 8:
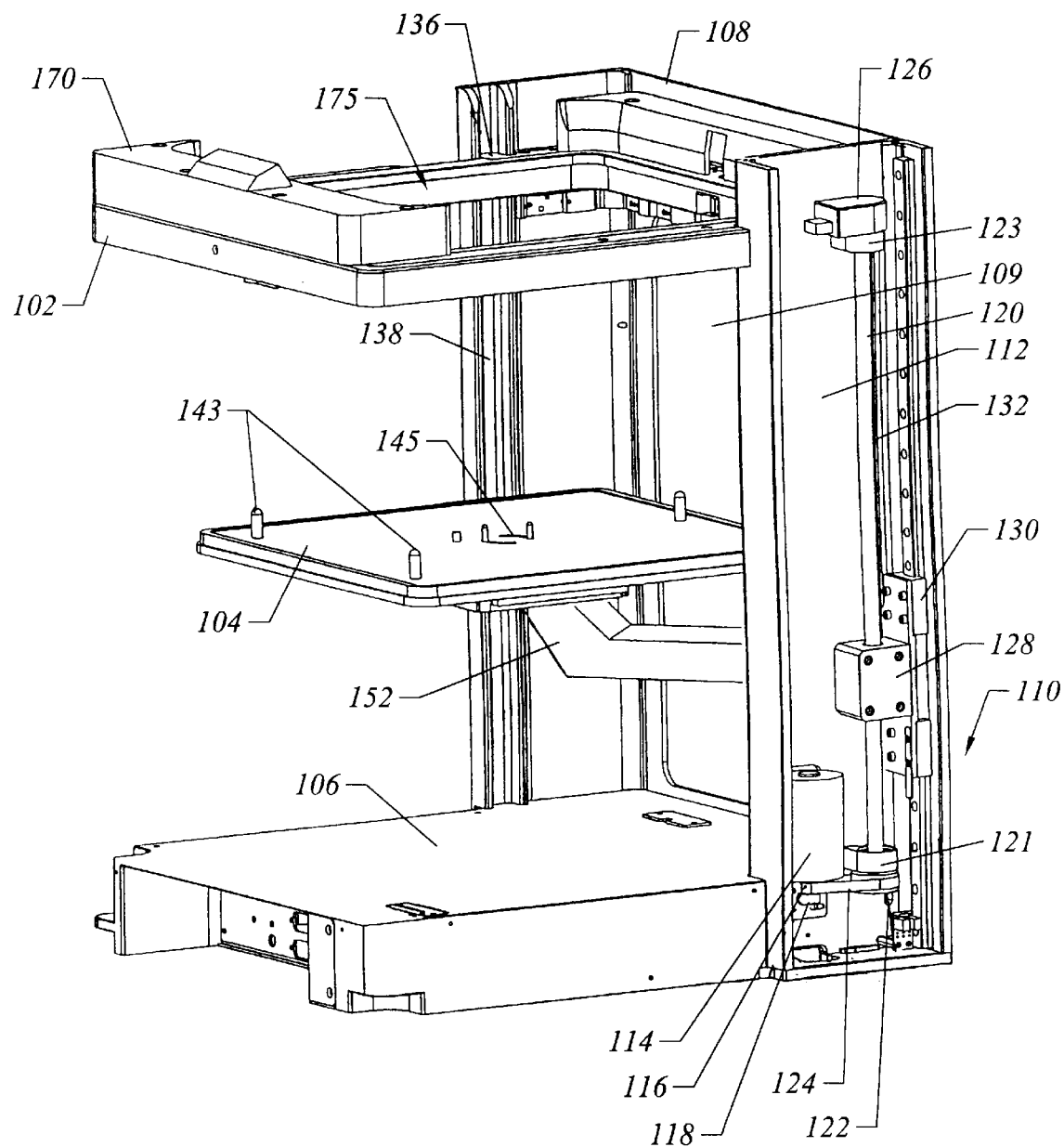
FIG. 8 is a perspective view of the universal interface and transfer apparatus according to the present invention configured as an indexer showing the port door lowered away from the port plate.
Figure 9:
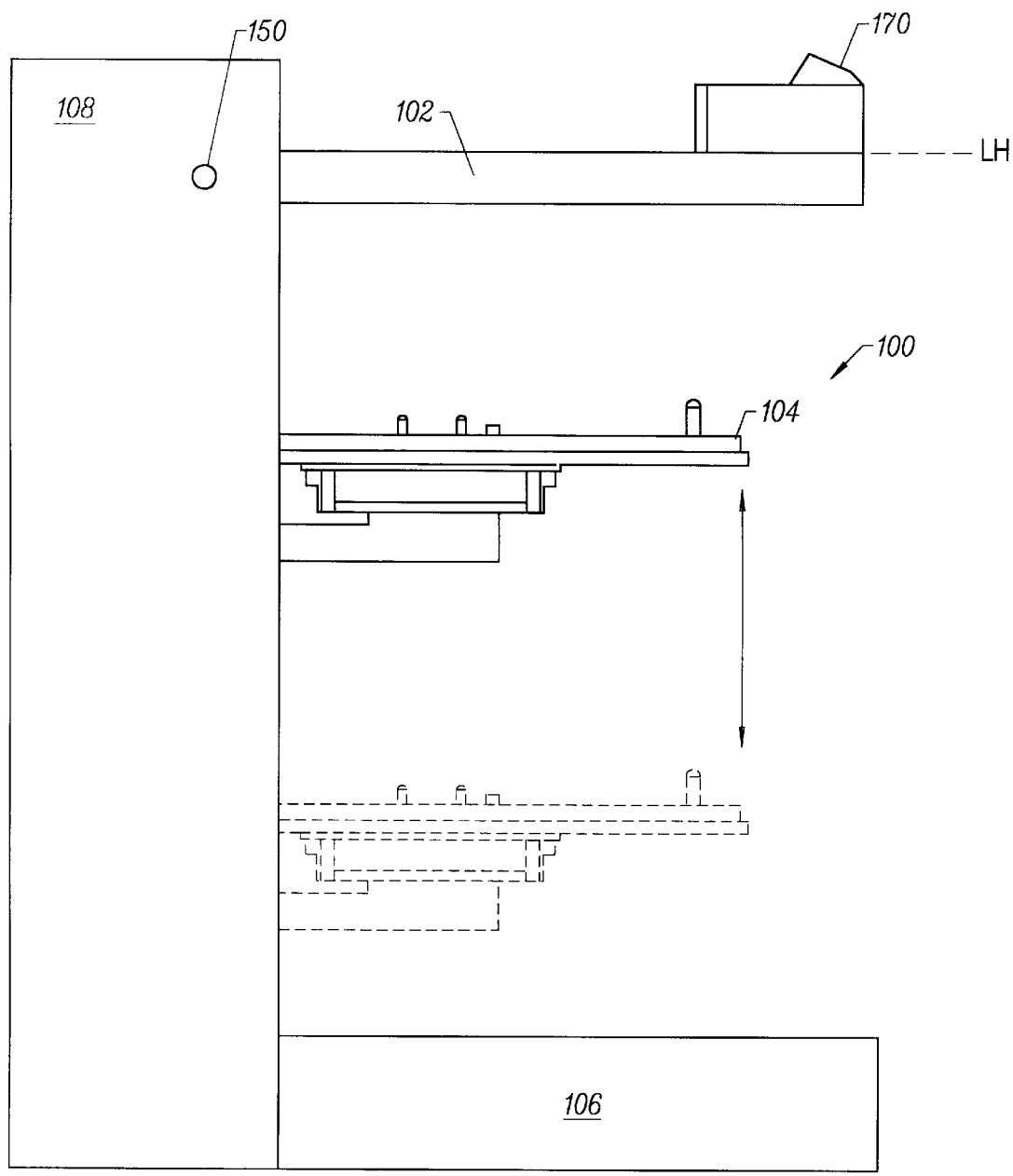
FIG. 9 is a side view of the universal interface and transfer apparatus according to the present invention configured as an indexer with the port door lowered away from the port plate.

The same universal interface and transfer mechanism 100 shown in FIGS. 1 and 3–7 may alternatively be configured as shown in FIGS. 2, 8 and 9. In particular, in order to change the apparatus 100 from the configuration shown in FIGS. 1 and 3–7 to that shown in FIGS. 2, 8 and 9, the port plate 102 is bolted to the frame 108 at its uppermost position by means of a bolt 150 fitting through openings in both sides of the frame 108. It is understood that port plate 102 may be held in position by mechanisms other than bolt 150 in alternative embodiments. Additionally, the screws or bolts 131 used to mount bracket 130 to gusset 134 on the port plate are removed. This configuration instead includes an arm 152 having a first end affixed to the bracket 130 by screws or bolts similar to those used in the first configuration, and a second end affixed to a lower surface of port door 104. In this configuration, the screws or bolts used to stationarily mount the port door to base 106 are removed and the standoffs 142 may additionally be removed. Thus, in the configuration shown in FIGS. 2, 8 and 9, the port plate remains in a fixed position and the port door translates with carriage 128 upon rotation of linear drive screw 120.

According to the configuration shown in FIGS. 2, 8 and 9, the universal interface and transfer apparatus 100 is mounted to a process tool with the port plate 102 and port door 104 located at a load height, indicated at line LH in FIG. 9, of approximately 900 mm. After loading of a pod onto the port plate and door, the pod door is decoupled from the pod shell as described above. Thereafter, a signal is sent to the control electronics to initiate operation of motor 114 and rotation of linear drive screw 120 to translate the carriage 128, bracket 130, arm 152, port door 104, the pod door and the cassette from their position shown in FIG. 2 downward to, for example, their position shown in FIG. 8. Once the port door has lowered so that the top of the cassette is clear of the port door, the pick and place robot within the process tool can then transfer the cassette and/or wafers into the process tool, and then back again after processing is complete.

A cover (omitted from the figures for clarity) may be provided around the sides and rear of apparatus 100 extending between the port plate 102 and base 106 to define a minienvironment within the apparatus 100. Unlike the configuration described with respect to FIGS. 1 and 3–7, the distance between the port plate and base remains stationary in this configuration, and no telescopic sections in the cover are necessary. The cover may instead be formed by three unitary walls around the sides and rear of the apparatus 100. It is understood that a cover including telescopic or accordion-type sections as described in the prior configuration may alternatively be used in this configuration. A fan and filtration system as described above may further be included for circulating fluid and filtering out particles and contaminants.

In the embodiments of the invention described thus far, a cassette in a pod is initially loaded on the apparatus 100 and thereafter separated from the pod as described above. In an alternative embodiment of the present invention, it is contemplated that a cassette may be loaded directly onto the port door 104, without a pod, according to either of the configurations described above. Thereafter, a top similar to a pod shell may be placed over the cassette, supported on the port plate 102, and then the port plate 102 raised (if configured according to FIG. 1) or the port door lowered (if configured according to FIG. 2) as described above.

While the apparatus 100 is mounted to a process tool in a preferred embodiment, it is understood that the apparatus may be mounted to other devices, or used as a stand-alone unit, in alternative embodiments. For example, the apparatus may be used as a stand-alone unit to separate a cassette from a pod where manual access to wafers within the cassette is desired.

Where a process tool is configured to work with a certain size wafer, such as for example 200 mm, when the pick and place robot from within the process tool extends into the apparatus 100 to acquire either a cassette or individual wafers, it expects the cassette or wafers to be at a particular position relative to the robot. However, at present, different size wafer geometries are popular, such as for example 150 mm and 200 mm, and it may be desirable to use 150 mm wafers in a process tool where the pick and place robot is configured to operate with 200 mm wafers or visa versa. In such an instance, there will be a variance between the actual position of the cassette or wafers within apparatus 100 and that at which the pick and place robot is calibrated to find the cassette or wafers.

Therefore, according to a further embodiment of the present invention, instead of the port door being stationarily mounted to base 106 (when configured as an LPO) or to arm 152 (when configured as an indexer), the port door may instead be translatably mounted to a plate. The plate is in turn fixedly mounted to the base 106 via standoffs 142 (when configured as an LPO), or fixedly mounted to arm 152 (when configured as an indexer). Once the port plate and port door have separated and the wafer cassette is ready for transport into the process tool, the plate may translate to locate the cassette at the position at which the pick and place robot expects to find the cassette. Such an embodiment also has use where a pick and place robot being used in a wafer fab has a relatively short horizontal reach. In such an instance, after the cassette is separated from the pod, the plate may translate inward toward the process tool to a position which may be accessed by the robot.

As can be appreciated by those skilled in the art, in order to provide horizontal translation, the port door may include one or more carriages on its lower surface, fixed about one or more horizontally oriented linear drive screws which are rotatably mounted to the plate. A motor and torque transmission mechanism, for example as described above, may be provided for rotating the linear drive screw and thus translating the carriage, port door, pod door and cassette toward and away from the process tool as desired.

It is known to provide an end effector including multiple forks, or tines, capable of fitting into a wafer-carrying cassette in between each wafer, moving upwards to lift each wafer off of its respective shelf, and then backing out of the cassette to transfer the wafers en masse into the processing tool. The wafers may also be returned to the cassette in the same manner. Therefore, according to a further alternative embodiment of the present invention operating with a robot having a multiple tine end effector, it is contemplated that the port door translate into the process tool as described above so that the tines of the end effector are positioned beneath each of the wafers in the cassette. Thereafter, the port door may lower slightly so that the wafers are transferred from their respective shelves onto the tines of the end effector. The end effector then backs out of the cassette with the wafers supported thereon.

In order to provide both horizontal and vertical translation, where the apparatus 100 is configured as an indexer, the port door may translate horizontally toward the multiple tine end effector as described above, and then the port door may lower slightly via the modular drive assembly 110 affixed to the port door. Where the apparatus 100 is configured as an LPO, the plate may be mounted to a vertical drive assembly (separate and independent from the modular drive assembly 110 affixed to the port plate) capable of vertically translating the plate and the port door affixed thereto. Thus, the port door is capable of horizontal translation on the plate and the plate is capable of vertical translation relative to the base 106. The vertical drive assembly according to this embodiment need only provide a vertical translation no greater than the pitch between wafers within the cassette. It is understood that instead of mounting the horizontal drive assembly on the vertical drive assembly as described above, the vertical drive assembly may be mounted on the horizontal drive assembly in alternative embodiments. When it is desired to return the wafers from the multiple tine end effector to the cassette, the end effector may position the wafers within the cassette, and the port door may thereafter rise upwards to lift the wafers off of the tines and onto the shelves within the cassette.

In a further alternative embodiment, instead of or in addition to translation, it is contemplated that the port door, may be pivotally mounted to the base 106. Such a configuration is shown and described in U.S. patent application Ser. No. 08/730,643, entitled "Load Port Opener", which Application has previously been incorporated by reference. This embodiment has use, for example, where a single robot is provided to access wafer cassettes from multiple load ports on the front of a single process tool. In such an embodiment, after the wafer cassette is separated from the pod, the plate on each of the load ports may translate into the process tool, and then rotate inward toward the robot so that the robot can access the wafers and/or cassette from both load ports. It is understood that he port door may be concentrically or eccentrically mounted for rotation.

Another alternative embodiment of the present invention will now be described with reference to FIGS. 10 through 12. According to this alternative embodiment, a pair of grippers 216a and 216b are mounted within or beneath the port plate 102 for gripping the cassette as the port plate moves upward or the port door moves downward. Details relating to such grippers are disclosed in U.S. Pat. No. 5,788,458, entitled, "Method and Apparatus for Vertical Transfer of a Semiconductor Wafer Cassette", previously incorporated by reference.

Figure 10:
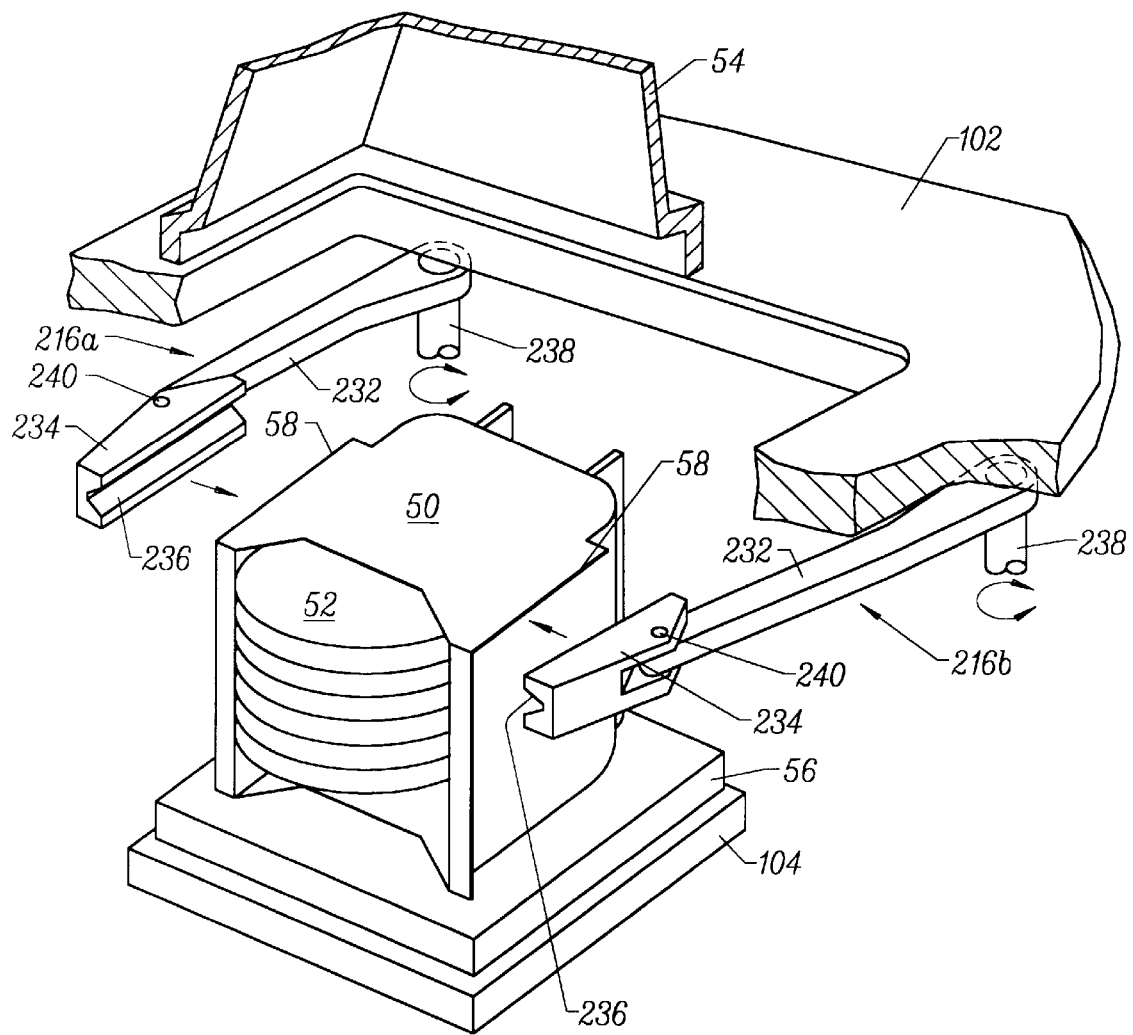
FIG. 10 is a partial perspective view of the universal interface and transfer apparatus according to an alternative embodiment.
Figure 11:
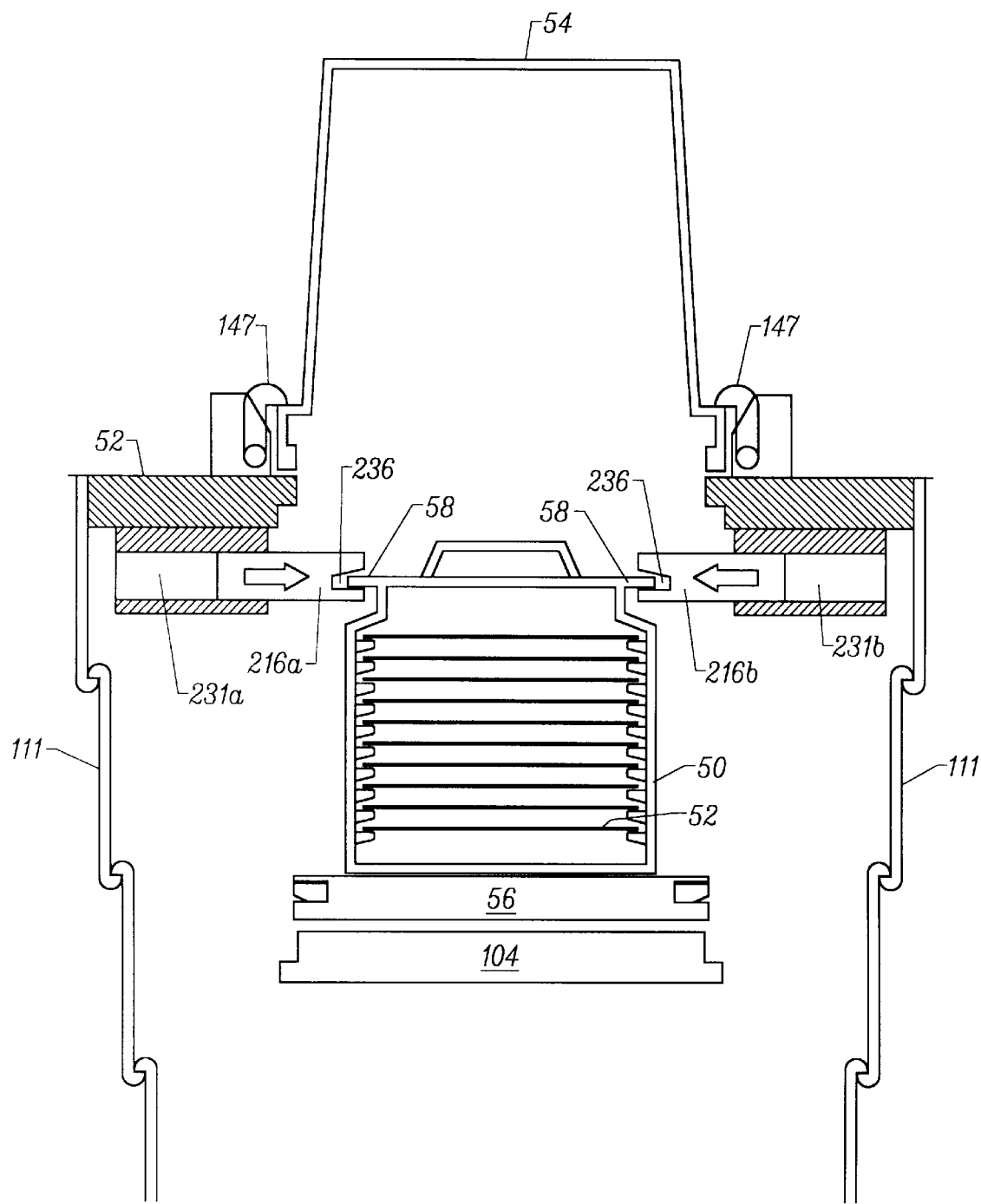
FIGS. 11 and 12 are front views of the universal interface and transfer apparatus according to the alternative embodiment of FIG. 10.
Figure 12:
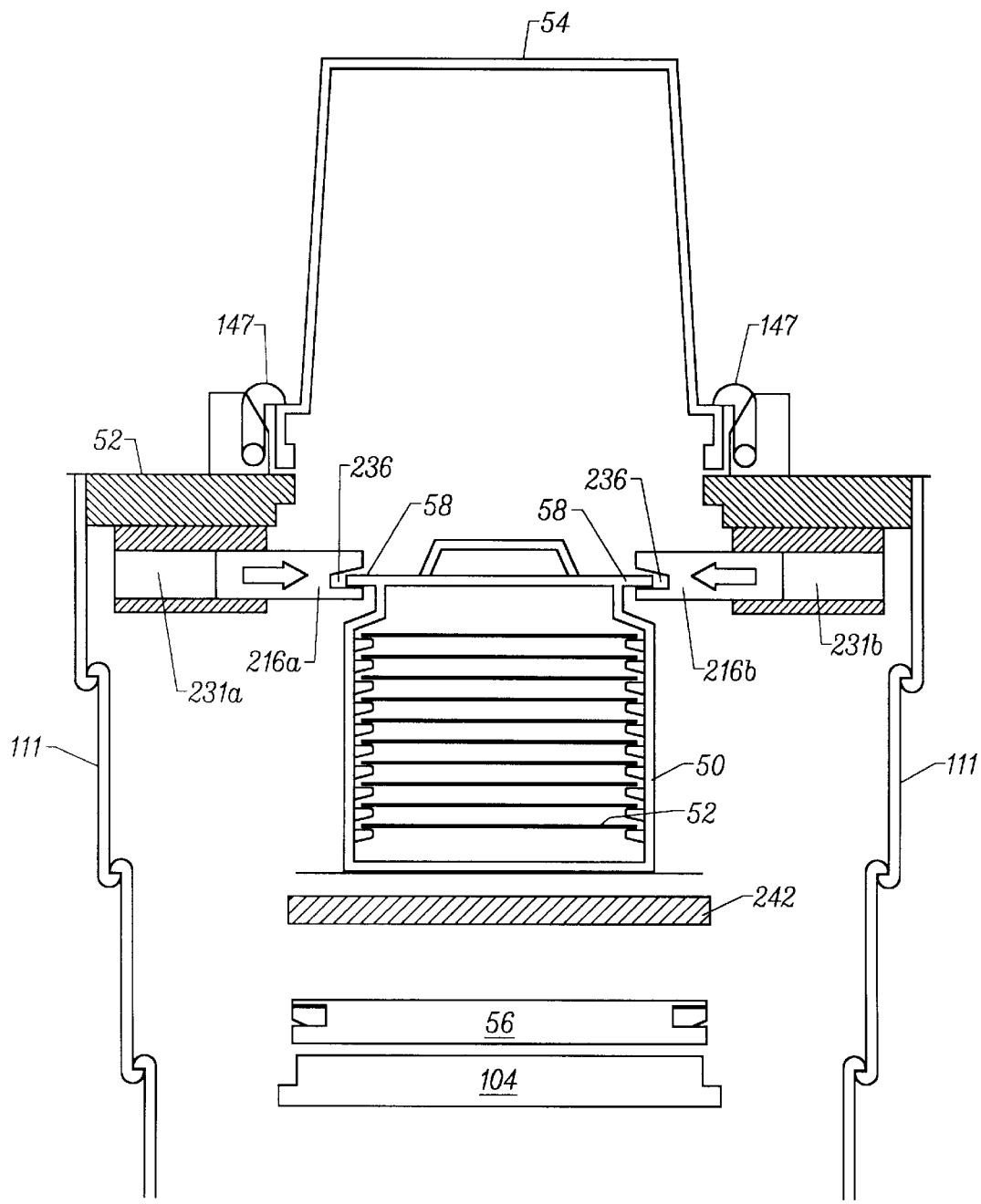

In the embodiment of FIGS. 10 through 12, at some point during the upward movement of the port plate 102 or the downward movement of the port door 104, the gripping arms 216a, 216b will reside in substantially the same horizontal plane as ears 58 conventionally formed on cassette 50. Once the gripping arms 216a, 216b are horizontally aligned with the ears 58, relative motion between the port plate and port door is halted by the control circuitry and the gripping arms 216a, 216b are moved inward toward ears 58 from their retracted position within recesses 231a and 231b.

Gripping arms 216a, 216b each include a longitudinal member 232 having a first end rotationally mounted to the port plate 102, and a gripping pad 234 pivotally mounted on the free end of each longitudinal member 232. Each gripping pad 234 may include a slot 236 in which are received the ears 58 when the gripping arms are pivoted into engagement with the cassette 50. The longitudinal members 232 may pivot with respect to the port plate 102 by being mounted on shafts 238 rotationally mounted on bearings (not shown) within the port plate 102. The gripping arms 216a, 216b are preferably mounted so as to rotate about a vertical axis. However, it is understood that the gripping arms may rotate about other axes. For example, the longitudinal members of the gripping arms may be mounted on shafts having axes that are parallel to the port plate 102 so that the gripping arms pivot about a horizontal axis. In such an embodiment, the gripping pads 234 would be provided at an angle with respect to the longitudinal members 232 so as to ensure that the slots 236 properly mate with the ears 58. It is further understood that the shafts 238 may be stationarily mounted within the port plate 102, and the longitudinal members rotationally mounted on the shafts.

A conventional drive system, such as a solenoid, stepper or multi-pole motor, or pneumatic mechanism, may cooperate with a conventional torque transmission mechanism to move the gripping arms 216a, 216b into their position of engagement with the cassette, and back again to their retracted position within recesses 231a, 231b. The operation of the drive system may be controlled by the control circuitry in the base 106.

The gripping pads 234 may be pivotally mounted to the longitudinal members 232 by pins 240, which pins allow gripping pads 234 to pivot slightly with respect to the longitudinal member. Other mounting configurations are contemplated. Gripping arm sensors (not shown) are preferably provided on either the gripping arms 216a, 216b or on the port plate 102 for sensing when the gripping arms 216a, 216b are in a home position, i.e., fully retracted within recesses 231a and 231b, respectively, and when the gripping arms are in an engaging position with the cassette. The gripping arm sensors may additionally sense when the gripping arms have pivoted past a position where cassette engagement is anticipated, to thereafter stop further inward rotation of the gripping arms. Thus, for example where no cassette is present, the gripping arms will rotate inward and stop when the absence of the cassette is detected.

As shown in FIG. 11, after the cassette is gripped by the gripping arms 216a, 216b, the port plate resumes its upward motion, or the port door resumes its downward motion, at least enough so that a platform 242, previously retracted within the process tool, may be extended from the tool to a position under the cassette 50. Operation of the platform may be controlled by control electronics for the process tool working in conjunction with control electronics for apparatus 100.

Where the apparatus 100 is configured as a load port opener, once the platform 242 has extended, the direction of rotation of the linear drive screw 120 may be reversed, to thereby lower the port plate so as to lower the cassette 50 onto the platform 242 as shown in FIG. 12. Where the apparatus 100 is configured as an indexer, the grippers 216a, 216b may themselves be mounted for slight vertical translation relative to the port plate so as to lower cassette 50 onto the platform 242. Once the cassette 50 is positioned on the platform 242, the gripping arms 216a, 216b may disengage the ears 58 and return to their retracted position within recesses 231a, 231b, respectively, within the port plate. The platform 242 may then retract to carry the cassette into the processing tool. Upon completion of processing, the above-steps may be repeated to return the cassette 50 to within the SMIF pod.

Up to this point, the apparatus 100 has been described as being affixed to the front end of a process tool. In an alternative embodiment, it is understood that the apparatus 100 may be a stand alone unit. In such an embodiment, when configured for example as an LPO, the apparatus may separate a cassette from a pod, and thereafter the plate on which the pod door is mounted may translate or rotate to present the cassette for manual or automated transfer away from the apparatus 100 as desired.

Figure 13:
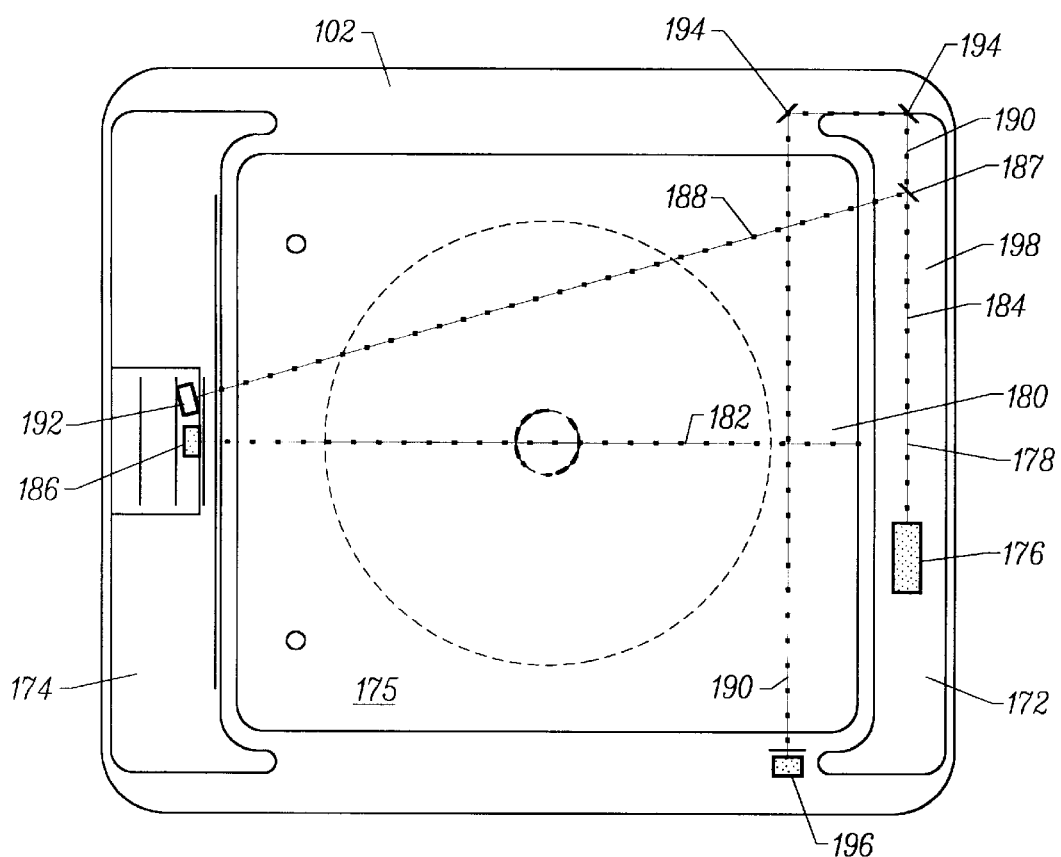
FIG. 13 is a schematic top view illustrating the optical wafer detection system according to the present invention.

Referring now to FIG. 13, the port plate 102 according to the present invention further includes an optical detector system 170 for sensing various characteristics of wafers as the port plate passes by the wafers or as the wafers pass by the port plate. A flexible, shielded ribbon cable (not shown) may be provided between the system 170 and the control electronics under the base for transferring the positional information and other signals. The port plate 102 includes a first mount 172, and a second mount 174 across a central aperture 175 in the outer support plate from first mount 172. The first and second mounts together house the components of the optical detector system as described hereinafter. A laser diode emitter 176 is preferably mounted within first mount 172 for emitting a beam 178. Although not critical to the present invention, the laser diode emitter 176 is integrated with a regulated power supply circuit and a focusable collimating lens, and emits a visible beam at 670 nanometers wavelength. The beam 178 is directed toward a beam splitter 180 oriented at 45° with respect to the beam 178 such that a first portion 182 of beam 178 is reflected across the central aperture 175, and a second portion 184 of beam 178 is transmitted through the beam splitter 180. The beam portion 182 is received within a wafer present sensor 186 provided within the second mount 174 on port plate 102. As the port plate 102 moves upward, or the wafer cassette moves downward as previously described, the wafer present sensor 186 is able to detect the elevational position of each wafer within the cassette. The beam portion 182 and sensor 186 may also be used to detect cross-slotted wafers, and the absence of a wafer from a particular slot.

The information from cassette present sensor 186 may preferably be transferred to the control circuitry and stored into memory for wafer mapping. The stored information is available for use by the computer to accurately position the pick and place robot for wafer retrieval without damage to the wafers.

The beam portion 184 passing through beam splitter 180 is further divided upon contact with a beam splitter 187. Beam splitter 187 is provided at an angle so as to reflect a portion 188 of the beam at an angle across the central opening 175 in the port plate, and to transmit a portion 190 therethrough. The beam portion 188 is received in a cassette slot sensor 192 provided in the second mount 174, which sensor 192 is aligned to receive the beam portion 188. The beam portion 188 is directed across the central opening 175 in the port plate so as to pass through a portion of the wafer support slots in the cassettes, which slots are provided to support the wafers within a cassette. As the port plate 102 moves upward or the port door 104 moves downward as described above, the beam portion 188 and cassette slot sensor 192 are able to detect the precise elevational position of a particular cassette slot. The information from the cassette slot sensor 192 may be transferred to the control circuitry and stored in memory for slot mapping, so that a pick and place robot may be positioned to return a wafer to the cassette at a known elevation of a particular cassette slot.

The wafers within the cassette are conventionally held in their proper position within the cassette while the cassette is sealed within the pod. If, for example, the apparatus is subjected to a shock as the port plate or port door are moving, one or more of the wafers may improperly protrude from the cassette. Moreover, where wafers are transferred by the pick and place robot from the processing tool to the cassette, the robot may not fully seat the wafers within their respective slots and one or more wafers may protrude from the cassette.

Therefore, the beam portion 190 transmitted through the beam splitter 187 is reflected off mirrors 194 which together reflect the beam portion 190 back 180° across a front section of the aperture 175, whereupon the beam portion 190 is received within a wafer protrusion sensor 196. As the port plate and port door move upward and downward, the beam portion 190 and wafer protrusion sensor 196 together detect any wafers which may be protruding beyond the front of the cassette. Upon activation of the sensor 196 by a protruding wafer, the computer causes a wafer seater mechanism (not shown) to move the out-of-position wafer into its proper location within the cassette. The beam portion 190 and wafer protrusion sensor 196 may additionally be used to detect the presence of a cassette on top of the port door, which information may be forwarded to the control circuitry as described above.

While a preferred embodiment of the optical detector system has been described above, it is understood that other sensing mechanisms may be provided for detecting the position of a wafer and for allowing wafer mapping. For example, IR or block-the-beam emitters and receivers may replace some or all portions of the beam emitted from diode 176 and the above-described sensors. Additionally, video cameras such as a charge coupled display (CCD) camera may be used. It is important that each of the portions of the beam emitted from the laser diode 176 travel in substantially horizontal planes. It is therefore a feature of the modular drive assembly 110 that it is capable of raising the port plate or lowering the port door through successive horizontal planes, substantially parallel to the planar surface of the wafers.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. An apparatus for facilitating transfer of a workpiece-carrying cassette between a pod and a process tool, the container including a pod door and a pod shell, the apparatus comprising:

a base;

a frame affixed to said base;

a translation assembly including a carriage capable of vertical translation with respect to said frame;

a port plate capable of supporting the pod shell and said port plate capable of being affixed to said carriage to vertically translate with respect to said frame and said port plate capable of being stationarily affixed to said frame;

a port door capable of supporting the pod door and said port door capable of being affixed to said carriage to vertically translate with respect to said frame and said port door capable of being stationarily affixed to said base; and means for affixing either said port plate or said port door to said carriage.

2. An apparatus for facilitating transfer of a workpiece-carrying cassette between a pod and a process tool as recited in claim 1, wherein said port plate is stationarily affixed to said frame and said means for affixing either said port plate or said port door to said carriage affixes said port door to said carriage.

3. An apparatus for facilitating transfer of a workpiece-carrying cassette between a pod and a process tool as recited in claim 1, wherein said port door is stationarily affixed to said base and said means for affixing either said port plate or said port door to said carriage affixes said port plate to said carriage.

4. An apparatus for facilitating transfer of a workpiece-carrying cassette between a pod and a process tool as recited in claim 1, further comprising a minienvironment extending between said base and said port plate.

5. An apparatus for facilitating transfer of a workpiece-carrying cassette between a pod and a process tool as recited in claim 1, wherein said port door is capable of horizontal translation with respect to said base.

6. An apparatus for facilitating transfer of a workpiece-carrying cassette between a pod and a process tool as recited in claim 1, wherein said port door is capable of pivoting around a pivot point on said base.

7. An apparatus for receiving a workpiece-carrying cassette and for presenting the workpiece carrying cassette and/or a workpiece from within the workpiece-carrying cassette for transfer away from the apparatus, the apparatus comprising:

a base;

a frame affixed to said base;

a translation assembly including a carriage capable of vertical translation with respect to said frame;

a port plate capable of being affixed to said carriage to vertically translate with respect to said frame and said port plate capable of being stationarily affixed to said frame;

a port door capable of supporting the workpiece-carrying cassette and said port door capable of being affixed to said carriage to vertically translate with respect to said frame and said port door capable of being stationarily affixed to said base; and means for affixing one of said port plate and said port door to said carriage.

8. An apparatus for receiving a workpiece-carrying cassette and presenting the workpiece carrying cassette and/or a workpiece from within the workpiece-carrying cassette for transfer away from the apparatus as recited in claim 7, wherein the apparatus is mounted to a process tool for processing the workpiece, the apparatus presenting the workpiece-carrying cassette and/or the workpiece to the process tool.

9. An apparatus for receiving a workpiece-carrying cassette and presenting the workpiece carrying cassette and/or a workpiece from within the workpiece-carrying cassette for transfer away from the apparatus as recited in claim 7, wherein the apparatus is a stand alone unit.

10. An apparatus for receiving a workpiece-carrying cassette and presenting the workpiece carrying cassette and/or a workpiece from within the workpiece-carrying cassette for transfer away from the apparatus as recited in claim 9, wherein the apparatus presents the workpiece-carrying cassette and/or the workpiece to an operator for manual transfer away from the apparatus.

11. An apparatus for receiving a workpiece-carrying cassette and presenting the workpiece carrying cassette and/or a workpiece from within the workpiece-carrying cassette for transfer away from the apparatus as recited in claim 7, wherein the workpiece-carrying cassette is received on the apparatus within a cassette-carrying container, the apparatus including mechanisms for separating the workpiece-carrying cassette from the cassette-carrying container.

12. An apparatus for receiving a workpiece-carrying cassette and presenting the workpiece carrying cassette and/or a workpiece from within the workpiece-carrying cassette for transfer away from the apparatus as recited in claim 7, wherein the workpiece-carrying cassette is received on the apparatus without a container thereabout.

13. An apparatus for receiving a workpiece-carrying cassette and presenting the workpiece carrying cassette and/or a workpiece from within the workpiece-carrying cassette for transfer away from the apparatus as recited in claim 7, wherein said port door is mounted for horizontal translation.

14. An apparatus for receiving a workpiece-carrying cassette and presenting the workpiece carrying cassette and/or a workpiece from within the workpiece-carrying cassette for transfer away from the apparatus as recited in claim 13, further comprising a vertical drive assembly, independent of said translation assembly for vertically translating said port door.

15. An apparatus for receiving a workpiece-carrying cassette and presenting the workpiece carrying cassette and/or a workpiece from within the workpiece-carrying cassette for transfer away from the apparatus as recited in claim 7, further comprising a bracket for mounting said port plate to said carriage.

16. An apparatus for receiving a workpiece-carrying cassette and presenting the workpiece carrying cassette and/or a workpiece from within the workpiece-carrying cassette for transfer away from the apparatus as recited in claim 7, further comprising an arm for mounting said port door to said carriage.

* * * * *